United States Patent
Zampini

[11] Patent Number: 5,932,389
[45] Date of Patent: Aug. 3, 1999

[54] CONTROLLED ALTERNATING AND BLOCK COPOLYMER RESINS

[75] Inventor: Anthony Zampini, Westborough, Mass.

[73] Assignee: Shipley Company, L.L.C., Marlborough, Mass.

[21] Appl. No.: 09/027,450

[22] Filed: Feb. 20, 1998

[51] Int. Cl.$^6$ .................................................. G03C 1/52
[52] U.S. Cl. ................... 430/192; 528/153; 528/156; 528/165; 528/193; 528/196; 430/191; 430/193
[58] Field of Search ..................................... 528/193, 196, 528/153, 156, 165; 430/192, 191, 193

[56] References Cited

U.S. PATENT DOCUMENTS

| | | | |
|---|---|---|---|
| 4,377,631 | 3/1983 | Toukhy et al. | 430/192 |
| 4,587,196 | 5/1986 | Toukhy | 430/192 |
| 4,614,826 | 9/1986 | Katayama et al. | 549/559 |
| 4,837,121 | 6/1989 | Blakeney et al. | 430/192 |
| 4,863,829 | 9/1989 | Furuta et al. | 430/192 |
| 5,130,410 | 7/1992 | Zampini | 528/218 |
| 5,216,111 | 6/1993 | Zampini | 528/143 |
| 5,340,687 | 8/1994 | Honda | 430/192 |
| 5,350,827 | 9/1994 | Sarubbi et al. | 528/155 |
| 5,473,045 | 12/1995 | Sizensky et al. | 528/129 |
| 5,576,139 | 11/1996 | Uenishi et al. | 430/192 |
| 5,674,657 | 10/1997 | Tan et al. | 430/191 |

*Primary Examiner*—Terressa Mosley
*Attorney, Agent, or Firm*—Darryl P. Frickey; Peter F. Corless; Robert L. Goldberg

[57] ABSTRACT

This invention relates to alternating and block copolymer resins of uniform and controlled chain length and methods for preparing the same. The alternating copolymer resins are formed from the reaction of a bisoxymethylphenol, a reactive phenolic compound and a monooxymethylphenol. The alternating copolymer may then be further reacted with a second reactive compound in the presence of an aldehyde to form the substantially blocked copolymer. The resins of the invention are characterized by a low molecular weight distribution. The resins are useful for the formulation of high resolution photoresist materials.

33 Claims, No Drawings

CONTROLLED ALTERNATING AND BLOCK COPOLYMER RESINS

BACKGROUND OF THE INVENTION

This invention relates to novolak resins, a novel process for making such resins and photoresists formulated using such resins as a binder. The resins are prepared from a mixture of a monooxymethyl and a bisoxymethyl phenolic compound reacted with another reactive phenol to produce an alternating copolymer. The addition of the monooxymethyl phenolic compound to the reaction mixture permits control and prediction of polymer dissolution properties and photospeed of a photoresist formulated using the resin. The alternating copolymers of the invention may be used alone or in blends with the same or other novolak resins and photoactive compounds to formulate a photoresist product.

DISCUSSION OF RELATED ART

The formation of novolak resins by condensation of a phenol with an aldehyde is well known in the art. Toukhy et al. in U.S. Pat. Nos. 4,377,631 and 4,587,196 disclose novolak resins produced by condensing a mixture of m-cresol and p-cresol or o-, m- and p-cresol with formaldehyde, with the various cresol isomers present by weight in selected proportions. The average molecular weight of the resins formed is a function of the number of cresol units that become linked by alkylene bridges as a result of the reaction with formaldehyde to form the resin molecules. The resin molecules formed are random in nature. The patent teaches that a higher molecular weight novolak may be obtained by increasing the ratio of formaldehyde to cresol thereby increasing the degree of linkage of the cresol units. The patent teaches that the maximum molar ratio of formaldehyde to cresols is 0.9:1. Higher molar ratios of formaldehyde with cresols leads to crosslinking and resin intractability, thereby limiting the extent to which the molecular weight can be controlled.

U.S. Pat. No. 4,830,413 discloses novolak resins obtained by the addition condensation of a phenol and formaldehyde wherein the phenol is one in which the average carbon number in any substituent per phenol nucleus is 0.5 to 1.5 and less than 50 mol % of the molecules have substituents at the ortho- or para-position with respect to the phenolic hydroxyl group. If specific conditions for selection of the phenol are not met, the resulting novolak will have a slow dissolution rate and will not exhibit expected improvement in optical properties.

U.S. Pat. No. 4,614,826 describes polynuclear polyhydric phenols prepared by reacting a dihydric phenol with a specific substituted phenol in the presence of an acid catalyst. The dihydric phenols used are catechol, resorcinol and hydroquinone. The substituted phenols used in the reaction are typically bishydroxyalkyl phenols. The dihydric phenol is ordinarily used in an amount of 1 to 8 moles per mole of the substituted phenol. The resulting polynuclear polyhydric phenols, which contain up to 10 polymer units, are low molecular weight resins. The resins are used to form polyepoxy compounds useful in crosslinking resist compositions.

U.S. Pat. No. 4,837,121 describes phenolic resins made by reacting a halogen-substituted resorcinol with a paralower alkyl-substituted 2,6-bis(hydroxymethyl)-phenol compound in the presence of an acid catalyst. The mole ratio of the resorcinol compound to the bisoxymethyl phenol compound used in the condensation reaction ranges from 0.5:1 to 1.7:1. Because of the position of the substituent on the phenolic rings, the condensation polymerization results in ortho-, ortho-bonding between each phenolic structure. The patent further describes the addition of third phenolic compound (m- or p- alkoxy substituted phenol) which will condense with the bisoxymethyl phenolic compound. However, with the third phenolic compound, only the para-alkoxy substituted phenol gives ortho-, ortho-bonding, while the meta-alkoxy substituted phenol give a mixture of ortho-, ortho-bonding and ortho-, para-bonding. The resulting resins have molecular weights from about 500 to 10,000. When resins containing the third phenolic compound are desired, they usually comprise about 20 to 60 percent of the phenol feed.

U.S. Pat. No. 5,130,410 is directed to novel alkali soluble novolak resins comprising the condensation product of a preformed bishydroxymethylphenol with a reactive phenol in the absence of an aldehyde to form an alternating copolymer. The alternating copolymer may then be further reacted with the same reactive phenol, a second reactive phenol or a mixture of phenols in the presence of an aldehyde to form a block copolymer. The method disclosed in said patent provides a novel novolak resin characterized by regular alternating copolymer structures since they are formed in the absence of an aldehyde as opposed to a random copolymer formed by earlier prior art methods. The polymers formed by the process are characterized by a narrow and controlled molecular weight distribution, whereby the weight average molecular weight to number average molecular weight ratio is in the range of 3 to 4 or lower.

Each of the above identified patents are incorporated herein by reference for their disclosure of methods for the formation of novolak resins, phenolics used to form the resins, and the use of the same in photoresist compositions.

SUMMARY OF THE INVENTION

The subject invention is an improvement in the invention described in U.S. Pat. No. 5,130,410. In accordance with the subject invention, a monooxymethyl phenolic compound is added to a reaction mixture of a bisoxymethyl phenolic compound and a reactive phenol. The monooxymethyl phenolic compound, having only a single reactive site, adds to the polymer at the ends of the polymer chain and consequently, functions as a terminus group altering certain physical properties of the copolymer, particularly dissolution or solubility properies.

It is an unexpected discovery of the invention that the terminus group on the copolymers of the invention have a significant and predictable physical effect on certain properties of a photoresist formulated using the copolymers of the invention. Accordingly, it is a discovery of the invention that photoresist dissolution properties and photospeed, in addition to other properties, can be effected by and controlled by selection of the monooxymethyl phenolic compound used to form the terminus group in accordance with the invention. It is a further discovery of this invention that the extent of the influence on such properties is greater than could be predicted.

DESCRIPTION OF THE PREFERRED EMBODIMENTS

The alternating novolak resins of the present invention are condensation products of monooxymethyl phenolic compounds, bisoxymethyl phenolic compounds and reactive phenols. The monooxymethyl phenolic compounds and the bisoxymethyl phenolic compounds that are particularly useful in the invention are represented by the following formulae:

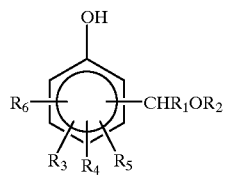

I

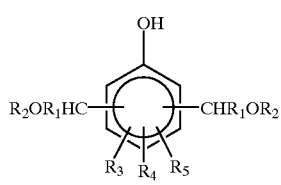

II where for each formula:

$R_1$ is hydrogen, an alkyl, an aryl, or a heterocyclic group, but preferably is H;

$R_2$ is hydrogen, an alkyl or an acyl group, but preferably is hydrogen or methyl;

$R_3$, $R_5$ and $R_6$ are each hydrogen, halogen, an alkyl group including cycloalkyl having from 1 to 12 carbon atoms, an alkoxy group having 1 to 4 carbon atoms, a phenoxy group, an aryl group or an arylalkyl group; and $R_4$ is the same as $R_3$ and $R_5$, and in addition is a carboxylic group.

The bisoxymethyl phenolic compound is highly reactive and often is in the form of its dimer having the following formula:

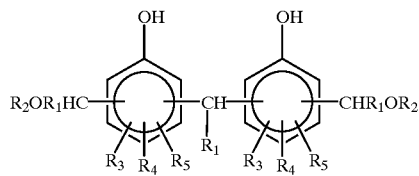

III where each of $R_1$ through $R_5$ is as defined above.

The bisoxymethyl phenolic compound may be formed by the reaction of formaldehyde with o-cresol, m-cresol, p-cresol, phenol, 2-phenyl phenol, 3-phenyl phenol, 4-phenyl phenol, 2,3-dimethyl phenol, 2,5-dimethyl phenol, 3,4-dimethyl phenol, 3,5-dimethyl phenol, 3,4,5-trimethyl phenol, 2-ethyl phenol, 4-ethyl phenol, 2-isopropyl-5-methyl phenol, p-propyl phenol, p-butyl phenol, p-nonyl phenol, bromophenols, fluorophenols, chlorophenols, trimethylsilylphenol, chloromethyl-phenols, acylphenols, p-hydroxybenzoic acid, p-nitro phenol, 2-cyclopentyl phenol, 4-cyclopentyl phenol, 2-cyclohexyl phenol, 4-cyclohexyl phenol, 5-cyclohexyl-2-methyl phenol, 2-cyclohexyl-5-methyl phenol, and the like, in the presence of a base. Suitable bases which will promote the reaction include alkaline earth metal hydroxides such as lithium and sodium hydroxide. The concentration of the formaldehyde in the reaction mixture together with solvents and reaction conditions will determine whether the bisoxymethyl phenolic compound or its dimer will be formed.

The monooxymethyl phenolic compounds are made in a manner similar to the bisoxymethyl phenolic compounds except that one or more of the phenolic reactive sites is desirably blocked with a blocking group to prevent formation of the bisoxymethyl phenolic compound. Any non-reactive group is satisfactory. The preferred blocking group is an alkyl group substituted onto the phenolic ring having from 1 to 8 carbon atoms, methyl being most preferred. Exemplary phenols suitable for formation of the monoxymethyl phenolic compound include 2,6-dimethyl phenol, 2-methyl-4-isopropyl phenol, 2,4-dimethyl phenol, 2,3,6-trimethyl phenol, 2,3,5,6-tetramethyl phenol, 2,3,4-trimethyl phenol, 2-cyclohexyl-4-methyl phenol, 2-cyclopentyl-4-methyl phenol, 4-cyclohexyl-2-methyl phenol, etc. The reaction conditions used to form the monoxymethyl phenolic compound and procedures would be substantially the same as used to form the bisoxymethyl phenolic compounds.

The oxymethyl groups of the above preformed phenols are reactive and in the presence of heat and acid or base, may react with other oxymethyl groups present in the reaction mixture, or with another reactive compound. If the reactive compound is another phenolic material, such as phenol, a cresol, a dimethylphenol, a trimethylphenol, a naphthol, a biphenol, a phenylphenol, a bis(hydroxyphenyl)methane, an isopropylidenebisphenol, a catechol, a resorcinol, a thiobiphenol or the like which contains at least two sites in the aromatic ring(s) of sufficient reactivity to undergo a facile Friedel-Crafts reaction, then the condensation reaction of the reactive compound with the preformed bisoxymethyl phenolic compound will sustain polymerization and result in the formation of the desired alternating copolymers. The key to formation of alternating copolymers rather than a random copolymer, is the absence of an aldehyde during reaction.

To prepare polymers in accordance with the invention, the reactants, i.e.—the monooxymethyl phenolic compound, the bisoxymethyl phenolic compound and the reactive phenol are dissolved in an appropriate non-reactive or non-interfering solvent and an acid catalyst is added. An aldehyde is desirably not present during the formation of the alternating copolymer. When a volatile reactive phenolic compound is used in excess, it may also serve as a solvent or co-solvent for the reaction mixture.

The condensation reaction leading to polymer formation may be carried out below, at, or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluene sulfonic acid and the like. In certain cases, an inorganic catalyst may also be used. Suitable inorganic catalysts include compounds of zinc, manganese, magnesium, aluminum, titanium, copper, nickel and cobalt. Upon completion of the condensation reaction, the solvent and unreacted reactive phenolic compound may be removed by volatilization under reduced pressure and elevated temperature. The preferred method by which the polymer may be recovered from the reaction mixture is by precipitation of the polymer into a liquid which is a non-solvent for the polymer but a solvent for the reaction solvent, catalyst and unreacted reactants. If this precipitation approach is used, the polymer is recovered and dried under reduced pressure. The resulting polymer is substantially a uniform alternating copolymer having a weight average molecular weight to number average molecular weight not exceeding 4 and preferably not exceeding 3. A structural representation of the copolymer formed with and without the monooxymethyl phenolic compound and showing the terminus group is set forth below:

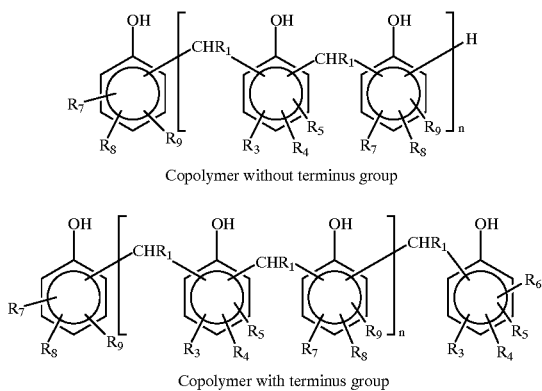

Copolymer without terminus group

Copolymer with terminus group where each of $R_1$, $R_2$, $R_3$, $R_4$, $R_5$ and $R_6$ are as described above, $R_7$, $R_8$ and $R_9$ are the same as $R_3$, $R_4$, $R_5$, and n is a whole integer equal to from 1 to 25 and preferably, from 1 to 15.

It is a discovery of this invention that the position of the hydroxyl group on the terminus group has a substantially greater effect on lithographic properties of a photoresist formulated using the resin than would be expected. In this respect, it has been discovered that if the phenolic hydroxyl on the terminus group is in the four position relative to the methylene bridging bonding the group to the polymer chain, dissolution properties and photospeed are substantially enhanced. If the phenolic hydroxyl on the terminus group is in the two position relative to the methylene bridging bonding the group to the polymer chain, resolution is substantially enhanced.

Examples of specific regular alternating copolymers prepared in accordance with the procedures of U.S. Pat. No. 5,130,410 compared to the end capped alternating copolymers of the subject invention are shown below where n is as above defined.

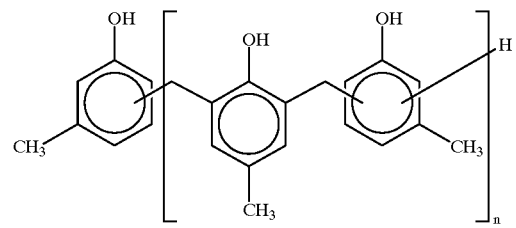

conventional alternating p-cresol, m-cresol resin

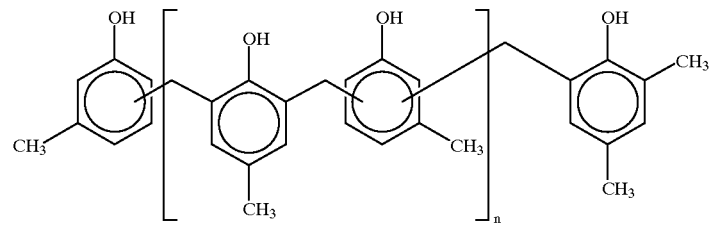

Alternating p-cresol, m-cresol resin with terminus group

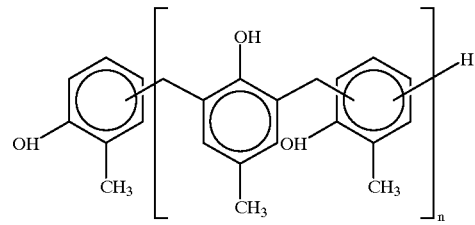

conventional alternating p-cresol, o-cresol resin

-continued

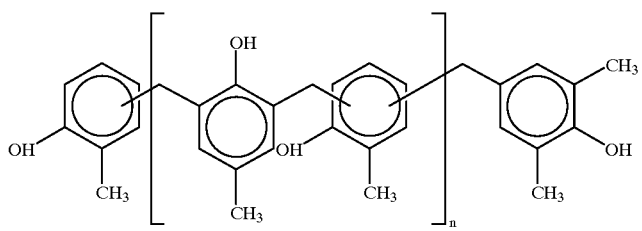

Alternating p-cresol, m-cresol resin with terminus group

To form the above polymers, the reactive phenol is used in slight molar excess of the bisoxymethyl phenolic compound to attain uniform alternating copolymers. Preferably, the molar ratio of the reactive phenol to the bisoxymethyl phenolic compound varies between about 1.2:1.0 to 2.3:1.0. The monooxymethyl phenolic compound is used in an amount equal to from about 1 to 30 mole percent of the total of the other phenolic reactants and more preferably, in an amount of from about 5 to 20 mole percent. It should be recognized that the lower concentration of the monooxymethyl phenolic compound promotes longer polymer chains while the higher concentration promotes shorter polymer chains. The reason for this is that the use of a monofunctional reactant terminates the polymerization reaction.

If a low concentration of the monooxymethyl phenolic compound is used to form the alternating copolymer, some polymer chains will be formed without the end terminus group of the invention. Under such circumstances, the polymer mixture can be further reacted with a second reactive phenol or mixtures of phenols. When the reaction is carried out in the presence of an acid and an aldehyde, the resulting resin is substantially a block copolymer. Such block copolymers are characterized by a controlled amount of at least one of the reactive phenols present in the polymer. For example, when reacting m-cresol with 2,6-bis(hydroxymethyl)-4-methylphenol (dimethylol p-cresol), the only source of p-cresol in the polymer will be the dimethylol p-cresol. Assuming complete consumption of the dimethylol p-cresol, the polymer will be characterized by a known amount of p-cresol present in the alternating copolymer.

The choice of the second reactive phenol compound for formation of the block copolymer may be from the same groups as used for the formation of the alternating copolymer. These compounds include phenol, cresols, dimethylphenols, trimethylphenols, naphthols, biphenols, phenylphenols, bis(hydroxyphenyl)methane, isopropylidenebisphenol, catechols, resorcinols, thiobiphenols or mixtures thereof, which contain at least two sites in the aromatic ring(s) of sufficient reactivity.

The choice of aldehydes for the reaction used to form the block copolymer may include any aldehyde containing the RCHO functionality, including alkyl aldehydes and aromatic aldehydes. Preferred aldehydes include formaldehyde, benzaldehyde, salicylaldehyde or mixtures thereof.

The following examples describe methods for preparation of resins using the prior art procedures set forth in U.S. Pat. No. 5,130,410.

COMPARATIVE EXAMPLE 1

Resin Formed from m-cresol and 2,6-bis(hydroxymethyl)-p-cresol

A 2-L four-neck resin kettle equipped with a stirrer, heating source, thermometer, variable reflux ratio distilling head and a nitrogen inlet tube was charged with 129.8 g m-cresol, 134.5 g 2,6-bis(hydroxymethyl)-p-cresol, 20 ml deionized water, 5.0 g oxalic acid dihydrate and 50 ml ethyl cellosolve acetate. The mixture was heated to about 60° C. at which point an exothermic condensation reaction ensued. The reaction was allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 217 g of an alternating resin having a number-average molecular weight, Mn, of 1640 Daltons and a Tg of 106° C. were obtained.

COMPARATIVE EXAMPLE 2

Resin Formed from m-cresol and 2,6-bis(hydroxymethyl)-p-cresol and Formaldehyde

A phenolic resin rich in alternating phenolic copolymer block segments was formed by first reacting a mixture of 519.0 g of 99 percent pure m-cresol, 538.2 g 97 percent pure 2,6-bis(hydroxymethyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the alternating copolymer. At 102° C., 32.6 g of 36.9 percent formaldehyde was added in 8 minutes to the reaction mixture to form substantially m-cresol-formaldehyde block segments and to chemically bond these segments to the previously formed alternating copolymer. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of a block copolymer resin having a number average molecular weight, $M_n$, of 1241 Daltons and a Tg of 112° C. were obtained.

COMPARATIVE EXAMPLE 3

Resin Formed from m-cresol, 2,6-bis(hydroxymethyl)-p-cresol and 1-naphthol

A mixture comprising of 72.1 g 1-naphthol, 84.1 g 2,6-bis(hydroxymethyl)-p-cresol, 5.0 g oxalic acid dihydrate and 150 ml ethyl cellosolve acetate in a 0.5-L resin kettle, equipped as in Example 1, was heated to initiate the condensation reaction substantially forming the 1-naphthol-methylene-p-cresol alternating copolymer. An exothermic reaction resulted, reaching a peak temperature of about 120° C. The reaction mixture was allowed to reflux for about 2 hours, at which time, 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 2. About 201 g of a block copolymer resin, having a number average molecular weight, $M_n$, of 1940 Daltons and a Tg of about 121° C. were obtained.

COMPARATIVE EXAMPLE 4

Resin Form from m-cresol and 2,6-dimethylol-p-cresol

To a one liter, three necked round bottom flask equipped with a stirrer, reflux condenser, thermometer and heating mantel were added 0.6 L methanol, 97.3 g of m-cresol and 100.9 g of 2,6-bis(hydroxymethyl)-p-cresol. The mixture, with stirring, was heated to 40° C. before 0.03 L of concentrated hydrochloric acid was added to catalyze the reaction. The reaction solution was then heated to 69° C. for 4 hours and cooled. Thereafter, the reaction solution was slowly added to 10 L of de-mineralized water to separate the product from the solvent and catalyst. The solid product was collected on a filter, washed with de-mineralized water and dried in a vacuum oven at 70° C. The thus obtained novolak resin had a weight average molecular weight of 4040 (reduced polystyrene basis), a polydispersity of 3.5, a glass transition temperature of 86° C. and a dissolution rate of 260 Å/sec in MFT 701 (Shipley Co. developer).

The following working examples better illustrate the invention as described herein.

EXAMPLE 5

Synthesis of An Alternating End-capped Resin

The resin was synthesized in the same manner as in the aforementioned Synthesis Example 4. Thus, the hydrochloric acid catalyzed condensation of 97.3 g of m-cresol, 100.9 g of 2,6-bis(hydroxymethyl)-p-cresol and 22.8 g of 2-hydroxy-3,5-dimethylbenzyl alcohol produced a novolak resin with a weight average molecular weight of 3600, a polydispersity of 3.36, a glass transition temperature of 89° C. and a dissolution rate of 259 Å/sec.

EXAMPLES 6 TO 11

The alternating novolak resins of Examples 6 to 11 were each synthesized in the same manner as in the aforementioned Example 5, except that the monomer species and their respective amounts (mole %) used in the condensation reaction were changed to those set forth in Table 1.

TABLE 1

| Example | Monomer mole % | | | | Mw | Mn | Mw/Mn | DR Å/sec | Tg, ° C. |
|---|---|---|---|---|---|---|---|---|---|
| | m-Cresol | DMPC | 2-HDBA | 4-HDBA | | | | | |
| 6 | 59 | 32 | 9 | | 1821 | 792 | 2.3 | 2197 | 68 |
| 7 | 59 | 32 | | 9 | 1874 | 840 | 2.23 | 4118 | 68 |
| 8 | 57 | 30 | | 13 | 1793 | 831 | 2.16 | 4846 | 65 |
| 9 | 52 | 35 | 13 | | 3094 | 983 | 3.15 | 288 | 82 |
| 10 | 55 | 36 | | 9 | 3704 | 1133 | 3.27 | 720 | 89 |
| 11 | 54 | 37 | | 9 | 4730 | 1281 | 3.69 | 333 | 93 |

DMPC is 2,6-bis(hydroxymethyl)-p-cresol
2-HDBA is 2-hydroxy-3,5-dimethylbenzyl alcohol
4-HDBA is 4-hydroxy-3,5-dimethylbenzyl alcohol
DR was measured using Shipley Co. MFT 701 developer

EXAMPLES 12 TO 16

The alternating novolak resins of Examples 12 to 16 were each synthesized in 2-propoleneglycol monomethyl ether in the same manner as in the aforementioned Example 5, except that the monomer species and their respective amounts (mole %) used in the condesation reaction were changed to those set forth in Table 2.

TABLE 2

| Example | Reactants (Mole Percent) | | | | Mw | Mn | Mw/Mn | DR Å/sec |
|---|---|---|---|---|---|---|---|---|
| | 2,3-Xylenol | DMPC | 2-HDBA | 4-HDBA | | | | |
| 12 | 60 | 30 | | | 1020 | 600 | 1.7 | 2535 |
| 13 | 55 | 36 | 9 | | 1615 | 890 | 1.81 | 250 |
| 14 | 55 | 36 | | 9 | 1620 | 900 | 1.8 | 510 |
| 15 | 60 | 30 | | 10 | 1000 | 650 | 1.54 | 4720 |
| 16 | 60 | 40 | | | 1660 | 900 | 1.84 | 220 |

The resins of the subject invention are useful as coating compositions, particularly for the formation of photoresist coating compositions. Photoresists are well-known in the art and described in numerous publications including DeForest, Photoresist Materials and Process, Graw Hill Book Company, New York, 1975. Photoresists comprise coatings produced from solution or applied as a dry film which, when exposed to light or the proper wave length, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

The positive-working resists comprise a light sensitive compound in a film-forming polymer binder. The light sensitive compounds, or sensitizers as they are often called, most frequently used are esters and amides formed from o-quinone diazide sulfonic and carboxylic acids. These esters and amides are well-known in the art and are described by DeForest, supra, pp. 47–55, incorporated herein by reference. These light sensitive compounds, and the mathods used to make the same, are all well documented and prior patents including German Patent No. 865,140 granted Feb. 2, 1953 and U.S. Pat. Nos. 2,767,092; 3,046,110; 3,046,112; 3,046,119; 3,046,121; 3,046,122 and 3,106,465 all incorporated herein by reference. Additional sulfonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213, incorporated herein by reference. Other positive-working diazo compounds have been used for specific purposes. For example, a diazo compound used as a positive-working photoresist for deep U.V. lithography is Meldrum's diazo and its analogs as described by Clecak et al., Technical Disclosure Bulletin, Volume 24, No. 4, September 1981, IBM Corporation, pp. 1907 and 1908 and o-quinone diazide compounds suitable for laser imaging as shown in U.S. Pat. No. 4,207,107. The aforesaid references are also incorporated herein by reference.

A class of negative resists comprising a negative-acting sensitizer in a polymer binder is described by Iwayanagi et al., IEEE transactions on electron devices, volume ED-28, No. 11, November, 1981, incorporated herein by reference. The resists of this reference comprise an aromatic azide in a phenolic binder. It is believed that these resists are first disclosed and claimed in U.S. Pat. No. 3,869,292, also incorporated herein by reference. Additional aromatic azide sensitizers are disclosed by DeForest, supra. and U.S. Pat. Nos. 2,940,853 and 2,852,379, incorporated herein by reference.

In the prior art, the above described positive resist using novolak resins as binders are most often used as a mask to protect substrates from chemical etching and photoengraving processes. For example, in a conventional process for the manufacture of a printed circuit board, a copper-clad substrate is coated with a layer of a positive working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with photoresist are protected, thereby defining a circuit pattern. For use in the manufacture of a semiconductor, the photoresist must possess resistance to chemical etching, must adhere to the surface of the semiconductor wafer, must be capable of very fine line image resolution, and must provide a photoresist having controlled and reproducible lithographic properties. The resins of the subject invention have a very uniform and ordered chain length. Consequently, photoresists formulated using the polymers of the invention have balanced hydrophobic/hydrophilic properties and possess unusually good reproducible lithographic properties. By selection of the monooxymethylated phenolic reactant, the terminus group of the polymer chain can be used to control both photospeed and resolution.

To formulate a photoresist using the resin binder of the invention, a radiation sensitive compound is admixed with the resin using art recognized procedures. The radiation sensitive compound used may be any of the various radiation sensitive compounds known to be suitable as photoactive compounds in photoresist compositions formulated with an alkali soluble polymer. Preferred compounds in accordance with the subject invention include esters formed from o-quinone diazide sulfonic and carboxylic acids. Alternatively, aromatic azide compounds may be used. More preferred sensitizers include esterified diazo naphthoquinone compounds. Especially preferred sensitizers include the 2,1,4-diazonaphthoquinone sulfonic esters and the 2,1,5-diazonaphthoquinone sulfonic acid esters. Other naphthoquinone diazide sulfonic acid esters suitable as sensitizers in the compositions of the invention are disclosed in Kosar, *Light Sensitive Systems*, John Wiley & Sons, 1965, pp. 343 to 352, incorporated herein by reference.

The amount of the sensitizer used in the photoresist composition and the manner of preparing the same is in accordance with art recognized procedures. In this respect, dependent upon the specific sensitizer and resin binder blend, the sensitizer can vary from 0.1 to 55 weight percent of the composition. In general, lower molecular weight sensitizers are used in lower amount while higher molecular weight sensitizers having backbones similar in structure to the resin binder can be used in higher concentrations. The difference in the concentration will be discussed below in connection with the most preferred embodiments of the invention.

The alternating copolymers of the subject invention can be used in any photoresist composition wherein a thermoplastic novolak resin is used as all or a portion of a binder. However, the description that follows describes specific most preferred embodiments of the invention.

In one most preferred embodiment of the invention, the alternating copolymer is used as one component of a blend of resins. For example, a suitable resin for blending with the alternating copolymer of the subject invention comprises the aromatic novolaks disclosed in U.S. Pat. No. 5,216,111 incorporated herein by reference. The aromatic novolak resins are acid catalyzed condensation products of one or more phenols and an aromatic aldehyde formed by the condensation of the reactants in the presence of a strong organic or mineral acid optionally in the presence of a divalent sulfur compound as a co-catalyst. The phenol is of the type conventionally used in the formation of novolak resins such as, for example, phenol itself, the cresols, xylenols, resorcinols, naphthols, bisphenols such as 4,4'- isopropylidenebisphenol and mixtures of such phenols. Preferred phenols include the cresols, m-cresol being most preferred because it yields a polymer having the most narrow molecular weight distribution.

In addition to the aromatic novolak resins, other conventional novolak resins and other phenolic resins suitable for use in a photoresist composition may be admixed with the alternating copolymer of the invention. The additional phenolic resin may be used in amounts of from 0 to 7 times the amount of the alternating copolymer and in accordance with one preferred embodiment of the invention, in an amount of from 0.1 to 5 times the amount of the alternating copolymer.

In a further preferred embodiment of the invention, the alternating copolymer, which may be in combination with another resin such as the above described aromatic novolak resin, is used with mixed photoactive compounds where one component of the mixture is an aromatic novolak resin condensed with an o-quinone diazide sulfonyl compound. Photoactive compounds comprising an aromatic novolak resin condensed with an o-quinone diazide sulfonyl compound are disclosed in U.S. Pat. No. 5,589,553 incorporated herein by reference. They are preferably condensation products of those resins having a molecular weight of at least 1,200 daltons and more preferably, a molecular weight ranging between 1,700 and 3,000 daltons, a glass transition temperature of at least 85° C. and preferably from about 130° C. to 220° C., a polydispersity (ratio of weight average molecular weight to number average molecular weight) of from 1.6 to 4.0; and a dissolution rate in a standard developer (polymer prior to esterification) of at least 200 angstroms per second and more preferably, from about 1,200 to 3,500 angstroms per second.

The aromatic novolak resin is esterified with an o-quinonediazide sulfonyl compound to form a photoactive component. Examples of suitable o-naphthoquinonediazide groups include a 1,2-naphthoquinonediazide-4-sulfonyl group, a 1,2-naphthoquinonediazide-5-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, and a 2,1-naphthoquinonediazide-8-sulfonyl group. These groups may be used alone or in combination as a mixture. Among these groups, a 1,2-naphthoquinonediazide-4-sulfonyl group and a 1,2-naphthoquinonediazide-5-sulfonyl group are particularly preferred.

The condensation reaction with the o-quinonediazide sulfonyl halide is carried our in a water miscible, non-interfering or inert solvent. Normally, the material to be esterified and the sulfonyl chloride are dissolved in acetone or dioxane forming an 8 to 25 w/w % solution. The solution temperature is adjusted and a solution of an organic base such as triethylamine (10 to 50 w/w %) which is slowly added to derive the reaction. This is followed by a reaction period of about 0.5 to 4 hours at a constant temperature. Normal reaction temperatures may vary from about 20° to 40° C. If the salt byproduct forms a precipitate, it is filtered and the filtrate neutralized with a mineral acid such as hydrochloric acid. If appropriate, the solution is filtered and then it is added to a non-solvent such as water to separate the esters from the solvent. After collection and washing, the product is dried under reduced pressure at about 30° to 55° C. When a 1,2-naphthoquinonediazide-4-sulfonate is used, the product is imaged at a wavelength of within the range of from 330 to 420 nm. When a 1,2-naphthoquinonediazide-5-sulfonate is used, the photoresist is desirably imaged at a wavelength within the range of 330 to 450 nm. Photoactive compounds of this nature may be used in higher concentration than comparable lower molecular weigh photoactive compounds and may be present in a concentration of from about 20 to 45 weight percent of solids.

When the alternating copolymers of the subject invention are used in combination with a photoactive compound that is the condensation product of an aromatic novolak resin, the photoactive compound may be used in larger concentration because of the compatibility of the backbone of the photoactive compound and the resin binder. In this instance, the photoactive compound may be present in amounts as high as 35 to 55 weight percent of total solids.

The alternating copolymer of the invention, with or without the addition of another phenolic resin, and with or without the naphthoquinone diazide sulfonyl esterification product of the aromatic resin, may also be used with other photoactive compounds. In this respect, another preferred photoactive compound suitable for use with the alternating copolymer of the invention is disclosed in U.S. Pat. No. 5,529,880 incorporated herein and comprises the esterification product of an o-quinone diazide sulfonyl compound and a high molecular weight phenol having from 2 to 5 phenolic rings and at least 4 hydroxyl groups where an average of at least 50% of the phenolic hydroxyl groups are esterified with the o-quinone diazide sulfonyl groups.

Preferred polyhydric phenols have at least two phenyl rings and at least two hydroxyl groups. Most preferred polyhydric monomeric phenols conform to the general formula:

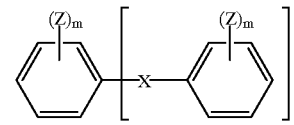

where each Z independently may be the same or different and each is a member selected form the group consisting essentially of a hydrogen atom, an alkyl group, an aryl group, a halogen atom or a hydroxyl group, provided that at least four of said Z's are hydroxyl and preferably, there is at least one hydroxyl group on each ring; each m is a whole integer varying between 1 and 5; X is a single bond or a member from the group consisting essentially of CO, S, O, $SO_2$, and $CR_1$ and $R_2$ where $R_1$ and $R_2$ each is independently a member selected from the group consisting of hydrogen, halogen, hydroxy, alkyl having 1 to 6 carbon atoms, alkoxy having 1 to 6 carbon atoms, and aryl and n is a whole integer varying between 1 and 4. Compounds corresponding to the above formula are known in the art and disclosed in multiple publications including U.K. Patent No. 935,250; EPO published application No. 0 341 608 A2, U.S. Pat. Nos. 3,188, 210; 4,266,000; 4,424,270; 4,555,469 and 5,290,656; each incorporated herein by reference. Suitable phenols represented by the above formula include 2,2',3,4-tetrahydroxybenzophenone, 2,4,2',4'-tetrahydroxydiphenyl sulfide, 2,2',4,4'-tetrahydroxydinaphthylmethane, 2,3,4,4'-tetrahydroxy-2,2'-methyl-5,5'-di-tert-butyldiphenyl sulfide, 4,4'-dihydroxydiphenyl sulfide, 4,6-bis-(2,4-dihydroxyphenylthio)-resorcinol, 2,4,2',4'-tetrahydroxy-3,5,3',5'-tetrabromodiphenyl sulfone, 2,4,2',4'-tetrahydroxy-3,5,3',5'-tetrabromobiphenyl and 2,2',4,4'-tetrahydroxy-3,5-dibromobenzophenone.

Other preferred polyhydric phenols include 4,4'-[(4-hydroxyphenyl)methylene]bis[2-methylphenol], 4,4'-[(2-hydroxyphenyl)methylene]bis[3-methylphenol], 2,6-bis(2, 4-dihydroxybenzyl)-p-cresol, 2,6-bis(2,4- dihydroxybenzyl)-3,4-dimethylphenol, 2,6-bis(2,4-dihydroxy-3-methylbenzyl)-4-methyl phenol, 2,6-bis(2,4-dihydroxy-5-ethylbenzyl)-4-methylphenol, α,α'-bis(2,4-dihydroxy-5-ethyl)phenyl-2-methylthiophene, α,α'-bis(2,4-dihydroxy-5-ethyl)phenyl-2-methyl-5-methylfuran, α,α'-bis(4-hydroxy-2,3,6-trimethyl)phenyl-2-methylthiophene, 4,4'-[(2-hydroxyphenol)methylene]bis[2,3,5-trimethylphenol], 4,4'-[2-hydroxyphenyl)methylene]bis[2,3,6-trimethylphenol], α,α'-bis(2,4-dihydroxy-5-ethyl)phenyl-2-methylphenol, α,α'-bis(2,4-dihydroxy-5-chloro)phenyl-2-methylphenol, α,α'-bis(3,4-dihydroxy-6-methyl)phenyl-2-methylphenol.

The photoactive compounds of a polyhydric phenol are formed by esterification using the materials and procedures described above.

A photoresist is prepared by dissolving the components in a suitable photoresist solvent. Known photoresist solvents include, for example, ether esters such as ethyl cellosolve acetate, methyl cellosolve acetate, and propylene glycol monomethyl ether acetate; ether alcohols such as ethyl cellosolve, methyl cellosolve, anisole, propylene glycol monomethyl ether; carboxylates such as ethyl acetate, butyl acetate and amyl acetate; lactones such as butyrolactone; cyclic ketones such as cyclohexanone and 2-heptanone; carboxylates of di-basic acids such as diethyloxylate and diethylmalonate; dicarboxylates of glycols such as ethylene glycol diacetate and propylene glycol diacetate; and hydroxy carboxylates such as ethyl-2-hydroxy propionate (ethyl lactate), and ethyl-3-hydroxy propionate. Solvents may be used alone or in admixture with each other and may be further mixed with non-solvents for one or more of the constituents. Suitable photoresist coating compositions can contain up to 50% by weight solids and preferably from 20 to 40% solids.

Other components may be added to a photoresist coating composition. For example, other phenolic resins such as aromatic novolak resins unreacted with the o-quinone diazide component, conventional novolak resins and polyvinylphenols may be mixed into the photoresist coating composition. The additional phenolic resins may be used in amounts of from 0 to 25 times the amount of the total of the photoactive components, preferably in amounts of 1 to 15 times the amount of the photoactive components and more preferably, in amounts of from 1 to 10 times the amount of the photoactive components. To augment performance, other conventional o-naphthoquinonediazide photoactive compounds may be added to the composition. Such materials are known in the art and disclosed in numerous patents including U.S. Pat. Nos. 3,046,118; 3,046,120; and 5,178,986, all incorporated herein by reference. The concentration of the additional photoactive compound can vary from between 1 and 30% by weight of the total of the resin components in the photoresist composition, inclusive of the aromatic novolak resin condensed with the o-quinonediazide sulfonyl group, and preferably between 2.5 and 20%. Other additives that may be added to the photoresist coating composition include actinic and contrast dyes, anti-striation agents, plasticizers and the like as would be known to those skilled in the art.

The following examples illustrate the preparation and performance of photoactive compounds and photoresist compositions in accordance with the invention.

EXAMPLE 17

An Alternating Resin Comprising of DMPC and Two Different Xylenols

The resin was synthesized in the same manner as in Example 16 except that 2,5-dimethylphenol was also included in the condensation reaction. Thus, the condensation of 74.2 g of 2,3-dimethylphenol, 33.0 g of 2,5-dimethylphenol and 104.7 g of 2,6-bis(hydroxymethyl)-p-cresol produced a novolak resin with a weight average molecular weight of 1920, a polydispersity of 1.86, a glass transition temperature of 88° C. and a dissolution rate of 243 Å/sec.

EXAMPLE 18

An m-Cresol Salicylaldehyde-Benzaldehyde Resin

A mixture of 778.6 grams of m-cresol, 453.1 grams of benzaldehyde, 357.8 grams of salicylaldehyde, 14.5 grams of 3-mercaptopropionic acid, 9.6 grams of p-toluenesulfonic acid monohydrate and 650 ml of propionic acid were charged into a 4-liter reaction vessel equipped with a paddle stirrer, reflux condenser and a nitrogen inlet tube. The mixture was heated to reflux and maintained at reflux for 4 hours. The more volatile components in the reaction mixture were then removed by distillation at ambient pressure under a constant flow of nitrogen. The mixture temperature was then raised and maintained between 141° and 145° C., and allowed to reflux for 1 hour to complete the reaction. Upon dilution with 1.6 liters of propionic acid, the resin solution was precipitated into 14 liters of deionized water. The product was collected on a filter, slurried in 14 liters of deionized water and dried at 110° to 115° C. About 1,485 grams of a brown powder having a weight average molecular weight of 1,790 Daltons and a polydispersity of 1.95 was obtained having a glass transition temperature of about 177° C.

EXAMPLE 19

An m-Cresol Salicylaldehyde-Benzaldehyde Resin

An Alternative Procedure

A mixture of 194.8 grams of m-cresol, 113.4 grams of benzaldehyde, 89.5 grams of salicylaldehyde, 1.0 liters of ethanol and 0.1 liters of concentrated hydrochloric acid were charged into a 2 liter 3-necked round bottom flask equipped with a mechanical stirrer, heating mantle, reflux condenser and a nitrogen inlet tube. The mixture was heated to and kept at reflux for about 24 hours. The reaction mixture was transferred to an addition funnel and slowly added into 6 liters of deionized water to precipitate the product. After a 4-hour soak, the precipitate was collected on a Buckner funnel aided by reduced pressure. The product was rinsed, re-slurried into 6 liters of deionized water and after a 1-hour soak, was again collected on the Buckner filter and rinsed. The resin was partially air dried to remove the bulk of the water and further dried under vacuum at 65° to 68° C. The yield was about 360.4 grams of powder having a glass transition temperature of about 158° C. and a weight average molecular weight of about 1823 Daltons.

EXAMPLE 20 o-Naphthoquinonediazide Esterified Aromatic Resins

A 1-L 3-necked round bottom flask equipped with a water bath, stirrer and thermometer was charged with 700 mL of acetone, 100 g of aromatic resin prepared according to Example 19 and having a dissolution rate of about 560 Å/sec., and 16.32 g of 1,2-naphthoquinone-(2)-diazide-5-sulfonyl chloride. The mixture was warmed up to about 30°

C. and a base solution comprising about 7.74 g of triethylamine in 25 mL acetone was slowly added in about 15 minutes. The reaction mixture was then maintained at about 30° C. for about 2 hours to complete the esterification reaction. After this period, the excess base was neutralized with hydrochloric acid and the solution slowly added to about 7 L of deionized water to precipitate the product. The product was collected using a Buchner funnel assisted by a partial vacuum, rinsed with water and reslurried in 3 L of water. Again, the product was collected with the funnel, rinsed with water and partially air dried on the filter. Final drying was achieved at about 40° to 50° C. under vacuum. About 110 g of esterified aromatic resin containing about 8.5 percent 1,2-naphthoquinone-(2)-diazide-5-sulfonic acid ester groups was obtained.

EXAMPLES 21 TO 24 AND COMPARATIVE EXAMPLES 26 TO 28

Photoresist compositions were prepared as follows:

Resins selected from Examples 4 to 20 and a 1,2-naphthoquinone diazide-5-sulfonyl mixed ester of 4,4'-[(2-hydroxyphenyl)methylene]bis[2,3,5-trimethylphenol] photoactive compound was dissolved in a solvent mixture of ethyl lactate, methyl phenol ether and amyl acetate (80:13:7). Total solids concentration was adjusted to 23.5%. The compositions of each are given below:

EXAMPLE 21

| | |
|---|---|
| Resin of Example 15 | 0.940 g |
| Resin of Example 16 | 9.400 g |
| Resin of Example 18 | 8.460 g |
| PAC | 4.700 g |
| Solvent | 76.500 g |

EXAMPLE 22

| | |
|---|---|
| Resin of Example 15 | 4.404 g |
| Resin of Example 16 | 6.606 g |
| PAC of Example 20 | 11.010 g |
| PAC | 1.480 g |
| Solvent | 76.500 g |

EXAMPLE 23

| | |
|---|---|
| Resin of Example 15 | 4.404 g |
| Resin of Example 17 | 6.606 g |
| PAC of Example 20 | 11.010 g |
| PAC | 1.480 g |
| Solvent | 76.500 g |

EXAMPLE 24

| | |
|---|---|
| Resin of Example 11 | 15.358 g |
| PAC of Example 20 | 5.119 g |
| PAC | 3.023 g |
| Solvent | 76.500 g |

COMPARATIVE EXAMPLE 25

| | |
|---|---|
| Resin of Example 16 | 10.340 g |
| Resin of Example 18 | 8.460 g |
| PAC | 4.700 g |
| Solvent | 76.500 g |

COMPARATIVE EXAMPLE 26

| | |
|---|---|
| Resin of Example 17 | 11.010 g |
| PAC of Example 20 | 11.010 g |
| PAC | 1.480 g |
| Solvent | 76.500 g |

COMPARATIVE EXAMPLE 27

| | |
|---|---|
| Resin of Example 4 | 15.358 g |
| PAC of Example 20 | 5.119 g |
| PAC | 3.023 g |
| Solvent | 76.500 g |

After the resultant mixtures were made into homogeneous solutions, the solutions were passed through a microfilter having a pore size of 0.2 μm. Each photoresist was coated onto a silicon or a bottom anti-reflective coating of Brewer XHRi-11 or XHRi-16 on silicon substrate (1100 Å or 1600 Å BARC) by means of spinner, and dried at 90° C. for 60 seconds with a vacuum contact hot plate, thereby forming a resist film having a thickness of 0.75–1.07 μm.

Each resist film was exposed to light by means of a reducing projection exposure apparatus (GCA XLS 7500 or ASML 5500/200) with different numerical aperture (NA) and partial coherence (PC), subjected to a post exposure bake at 110° C. for 60 seconds, developed for 60 seconds with 0.26N tetrabuthylammonium hydroxide aqueous solution, washed with D.I water for 15 seconds, and then spin dried.

TABLE 3

| Sample | Substrate | Thickness (μm) | NA/PC | Eo (mj/cm$^2$) | Es (mj/cm$^2$) | Size (μm) | Resolu. (μm) | DOF (μm) | Wall Angle (Θ) | Profiles |
|---|---|---|---|---|---|---|---|---|---|---|
| Example 21 | 1100ÅBARC | 0.86 | 0.55/0.54 | 102 | 255 | 0.350 | 0.290 | N/A | 88 | no scum |
| Example 22 | 1100ÅBARC | 0.86 | 0.55/0.54 | 90 | 218 | 0.350 | 0.300 | N/A | 89 | no scum |
|  | 1600ÅBARC | 0.75 | 0.6/0.75 | 85 | 230 | 0.300 | 0.250 | 1.6 | 89 | no scum |
| Example 23 | 1600ÅBARC | 0.75 | 0.6/0.75 | 73 | 185 | 0.300 | 0.250 | 1.6 | 89 | no scum |
| Example 24 | Si | 0.97 | 0.57/0.6 | 84 | 166 | 0.350 | 0.310 | N/A | 87 | slight scum |
| Comp. Ex. 1 | 1100ÅBARC | 0.86 | 0.55/0.54 | 108 | 253 | 0.350 | 0.300 | N/A | 88 | no scum |
| Comp. Ex. 2 | 1600ÅBARC | 0.75 | 0.6/0.75 | 79 | 193 | 0.300 | 0.255 | 0.9 | 89 | no scum |
| Comp. Ex. 3 | Si | 0.97 | 0.57/0.6 | 121 | 250 | 0.350 | 0.320 | N/A | 86 | slight scum |

Each resist pattern was observed under a scanning electron microscope (SEM), and thereby the resist performance was evaluated in Table 3.

In the evaluation, the Eo is defined as the minimum exposure energy to clear the resist film in open frame. Es is defined as the exposure energy required for producing the sizing features indicated in Table 3. The resolution was expressed as the limiting resolving power under the Es exposure energy.

The DoF is depth of focus latitude evaluated by performing profile observation from the SEM pictures in which 0.30 μm lines remain their full film thickness.

The resist pattern shape is represented by wall angle (θ) at the sizing features. The scum is represented by the extent of scum generated upon the formation of the sizing features.

As can be seen in Table 3, the resists (Examples 21 to 24) containing end-capped resins are superior in photospeed (Eo and Es), resolution and DoF to those without end-capped resins (Comparative Examples 25 to 28). Combination of the end-capped resins with aromatic novolak PAC. in Example 22 and Example 23 demonstrates specially high resolution, wide DoF and straight wall without scum.

In Example 21, an end-capped resin (Resin 15) was blended with an alternating resin (Resin 16), a resin linked with aromatic aldehyde (Resin 18), and a small PAC. By comparison, Comparative Example 1 did not contain the end-capped resin.

In Example 22 and Example 23, an end-capped resin (Resin 15) was blended with an alternating resin (Resin 16 or Resin 17), a small PAC, and an aromatic novolak PAC. (Resin 20). Combination of the end-capped resin and the aromatic novolak PAC. in Example 22 and Example 23 generates high resolution, wide DoF and straight wall profiles. By comparison, Comparative Example 2 did not contain the end-capped resin.

In Example 24, an end-capped resin (Resin 11) was blended with aromatic novolak PAC. (Resin 20) and a small PAC. By comparison, Comparative Example 3 did not contain the end-capped resin.

I claim:

1. A copolymer having enhanced dissolution properties, said copolymer having the structural formula:

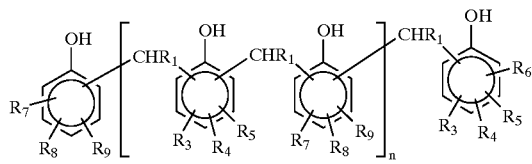

where:
$R_1$ is a member selected from the group consisting of hydrogen, alkyl including cycloalkyl having from 1 to 12 carbon atoms and aryl;

$R_3$, $R_5$ and $R_6$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl;

$R_4$ is selected from the group consisting of $R_3$ and $R_5$, and carboxylic;

$R_7$, $R_8$ and $R_9$ are the same as $R_3$, $R_4$, $R_5$; and n is a whole integer equal to from 1 to 25.

2. The copolymer of claim 1 where $R_1$ is hydrogen.

3. The copolymer of claim 1 where $R_5$ and $R_6$ are methyl.

4. The copolymer of claim 1 where $R_1$ is hydrogen, $R_5$ and $R_6$ are methyl and $R_3$, $R_4$, $R_7$, $R_8$ and $R_9$ are each hydrogen.

5. The copolymer of claim 1 where n is a whole integer equal to from 5 to 15.

6. The copolymer of claim 1 where the phenolic hydroxide of at least one terminus group of the polymer is in the four position relative to alkylene group bonding the terminus group to the polymer chain.

7. The copolymer of claim 1 where the phenolic hydroxide of at least one terminus group of the polymer is in the two position relative to alkylene group bonding the terminus group to the polymer chain.

8. A copolymer having controlled dissolution properties formed by reaction of a monooxymethyl phenol monomer, a bisoxymethyl phenol monomer and an additional phenol having at least two reactive sites on its aromatic nucleus, said additional phenol being present in molar excess of said bisoxymethyl phenol monomer and said monooxymethyl phenol monomer being present in an amount of from 1 to 30 mole percent of all of said phenolic monomers, said copolymer being formed in the absence of an aldehyde.

9. The copolymer of claim 8 where the molar ratio of the bisoxymethyl phenol to the additional phenol varies from about 1.2:1.0 to 2.3:1.0.

10. The copolymer of claim 8 where the concentration of the monoxymethyl phenol monomer varies between about 5 to 20 mole percent of the total of the phenols.

11. The copolymer of claim 8 where the monooxymethyl phenol monomer conforms to the structure:

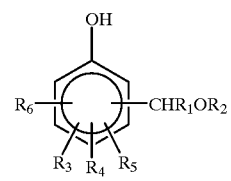

where:
$R_1$ is a member selected from the group consisting of hydrogen, alkyl including cycloalkyl having from 1 to 12 carbon atoms and aryl;

$R_2$ is a member selected from the group consisting of hydrogen, an alkyl having from 1 to 4 carbon atoms and acyl;

$R_3$, $R_5$ and $R_6$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl; and $R_4$ is selected from the group consisting of $R_3$ and $R_5$, and carboxylic.

12. The copolymer of claim 8 where the bisoxymethyl phenol monomer conforms to the structure:

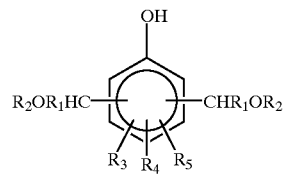

where:
$R_1$ is a member selected from the group consisting of hydrogen, alkyl including cycloalkyl having from 1 to 12 carbon atoms and aryl;

$R_2$ is a member selected from the group consisting of hydrogen, an alkyl having from 1 to 4 carbon atoms and acyl;

$R_3$ and $R_5$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl; and $R_4$ is selected from the group consisting of $R_3$ and $R_5$, and carboxylic.

13. The copolymer of claim 8 where the bisoxymethyl phenol monomer is a dimer conforming to the structure:

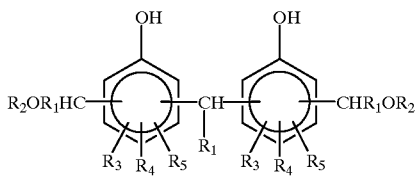

where:
- $R_1$ is a member selected from the group consisting of hydrogen, alkyl including cycloalkyl having from 1 to 12 carbon atoms and aryl;
- $R_2$ is a member selected from the group consisting of hydrogen, an alkyl having from 1 to 4 carbon atoms and acyl;
- $R_3$ and $R_5$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl; and
- $R_4$ is selected from the group consisting of $R_3$ and $R_5$, and carboxylic.

14. The copolymer of claim 8 where $R_1$ is hydrogen.
15. The copolymer of claim 8 where $R_5$ is methyl.
16. The copolymer of claim 8 where $R_1$ is hydrogen, $R_5$ is methyl and $R_3$ and $R_4$ are each hydrogen.
17. The copolymer of claim 8 having where n is a whole integer equal to from 1 to 25.
18. The copolymer of claim 8 having where n is a whole integer equal to from 1 to 15.
19. The copolymer of claim 8 where the phenolic hydroxide of at least one terminus group of the polymer is in the four position relative to alkylene group bonding the terminus group to the polymer chain.
20. The copolymer of claim 8 where the phenolic hydroxide of at least one terminus group of the polymer is in the two position relative to alkylene group bonding the terminus group to the polymer chain.
21. A process for forming a copolymer having controlled dissolution properties, said process comprising the steps of mixing a monooxymethyl phenol monomer, a bisoxymethyl phenol monomer and an additional phenol having at least two reactive sites on its aromatic nucleus, said additional phenol being present in molar excess of said bisoxymethyl phenol monomer and said monooxymethyl phenol monomer being present in an amount of from 1 to 30 mole percent of all of said phenolic monomers, said reaction being conducted in the absence of an aldehyde.
22. The process of claim 21 where the molar ratio of the bisoxymethyl phenol to the additional phenol varies from about 1.2:1.0 to 2.3:1.0.
23. The process of claim 22 where the concentration of the monoxymethyl phenol monomer varies between about 5 to 20 mole percent of the total of the phenols.
24. The process of claim 19 where the monooxymethyl phenol monomer conforms to the structure:

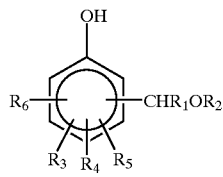

where:

- $R_1$ is a member selected from the group consisting of hydrogen, alkyl including cycloalkyl having from 1 to 12 carbon atoms and aryl;
- $R_2$ is a member selected from the group consisting of hydrogen, an alkyl having from 1 to 4 carbon atoms and acyl;
- $R_3$, $R_5$ and $R_6$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl; and
- $R_4$ is selected from the group consisting of $R_3$ and $R_5$, and carboxylic.

25. The process of claim 22 where the bisoxymethyl phenol monomer conforms to the structure:

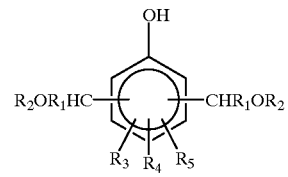

where:
- $R_1$ is a member selected from the group consisting of hydrogen, alkyl including cycloalkyl having from 1 to 12 carbon atoms and aryl;
- $R_2$ is a member selected from the group consisting of hydrogen, an alkyl having from 1 to 4 carbon atoms and acyl;
- $R_3$ and $R_5$ are each selected from the group consisting of hydrogen, halogen, an alkyl group including cycloalkyl having from 1 to 12 carbon atoms, alkoxy having from 1 to 4 carbon atoms, phenoxy, aryl and arylalkyl; and
- $R_4$ is selected from the group consisting of $R_3$ and $R_5$, and carboxylic.

26. The process of claim 22 where $R_1$ is hydrogen.
27. The process of claim 22 where $R_1$ is hydrogen, $R_5$ is methyl and $R_3$ and $R_4$ are each hydrogen.
28. A photoresist comprising a radiation sensitive compound and a copolymer comprising the formula:

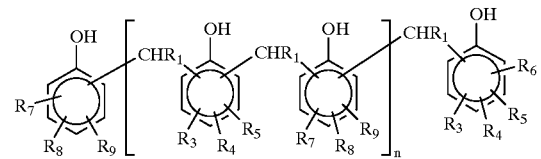

wherein $R_1$ is a member selected from the group consisting of hydrogen, alkyl including cycloalkyl having from 1 to 12 carbons and aryl;
- $R_3$, $R_4$ and $R_5$ are each independently selected from the group consisting of hydrogen, halogen, an alkyl group including cyclakyl having from 1 to 12 carbons, alkoxy having from 1 to 4 carbon atoms, phenoxy, aryl and arylalkyl;
- $R_4$ is slected from the group consisting of $R_3$, $R_5$ and carbocyclic;
- $R_7$, $R_8$ and $R_9$ are the same as $R_3$, $R_4$ and $R_5$; and
- n is a whole integer equal to from 1 to 25.

29. A photoresist of claim 28 wherein the photoresist is a positive-acting photoresist.

30. A photoresist of claim 28 wherein the photoresist is a negative-acting photoresist.

31. A photoresist comprising a radiation sensitive compound and a copolymer obtainable by reaction of a monoxymethylphenol monomer, a bisoxymethyl phenol monomer and an additional phenol having at least two reactive sites on its aromatic nucleus, the additionalphenol being present in molar excess of the bisoxymethyl phenol monomer and the monooxymethyl phenol monomer being present in an amount of from 1 to about 30 mole percent of all of the phenolic monomers, the copolymer being formed in the absence of an aldehyde.

32. A photoresist of claim 31 wherein the photoresist is a positive-acting photoresist.

33. A photoresist of claim 31 wherein the photoresist is a negative-acting photoresist.

* * * * *